(12) United States Patent
Britcher et al.

(10) Patent No.: US 9,882,067 B2
(45) Date of Patent: Jan. 30, 2018

(54) INSTALLATION SYSTEM FOR PHOTOVOLTAIC MODULES

(75) Inventors: Eric Bramwell Britcher, San Jose, CA (US); Jeffrey Allen Moore, San Jose, CA (US)

(73) Assignee: Brittmore Group LLC, San Jose, CA (US)

( * ) Notice: Subject to any disclaimer, the term of this patent is extended or adjusted under 35 U.S.C. 154(b) by 726 days.

(21) Appl. No.: 13/553,795

(22) Filed: Jul. 19, 2012

(65) Prior Publication Data

US 2013/0019925 A1    Jan. 24, 2013

Related U.S. Application Data

(60) Provisional application No. 61/509,471, filed on Jul. 19, 2011.

(51) Int. Cl.
| | | |
|---|---|---|
| *F24J 2/52* | (2006.01) | |
| *H01L 31/02* | (2006.01) | |
| *H02S 20/00* | (2014.01) | |
| *H02S 20/30* | (2014.01) | |

(52) U.S. Cl.
CPC ............ *H01L 31/02* (2013.01); *H02S 20/00* (2013.01); *H02S 20/30* (2014.12); *F24J 2/5232* (2013.01); *F24J 2002/5273* (2013.01); *F24J 2002/5281* (2013.01); *Y02E 10/50* (2013.01); *Y10T 29/49355* (2015.01)

(58) Field of Classification Search
CPC ......... F24J 2002/5281; F24J 2002/5273; F24J 2/5232; H02S 20/00
USPC ..... 104/89, 95, 124, 125; 105/148, 149, 155
See application file for complete search history.

(56) References Cited

U.S. PATENT DOCUMENTS

| | | | | |
|---|---|---|---|---|
| 4,345,582 | A * | 8/1982 | Aharon | F24J 2/10 |
| | | | | 126/574 |
| 5,652,489 | A * | 7/1997 | Kawakami | G05D 1/0242 |
| | | | | 318/568.12 |
| 6,675,068 | B1 * | 1/2004 | Kawasaki | B25J 9/0084 |
| | | | | 244/158.1 |
| 8,056,554 | B2 * | 11/2011 | Hinderling | 126/628 |
| 8,657,991 | B2 * | 2/2014 | Potter et al. | 156/297 |
| 9,020,636 | B2 * | 4/2015 | Tadayon | 700/247 |
| 2008/0230047 | A1 * | 9/2008 | Shugar | F24J 2/525 |
| | | | | 126/569 |

(Continued)

*Primary Examiner* — Anna Momper
*Assistant Examiner* — Mark Hageman
(74) *Attorney, Agent, or Firm* — Rohm & Monsanto, PLC

(57) ABSTRACT

A solar panel array is formed of a plurality of solar panels juxtaposed with one another along an array axis, and has a support element having first and second support terminations disposed substantially orthogonal to the array axis, with an unobstructed spatial region intermediate of the first and second support terminations. A vehicle transports the solar panels and has wheels arranged on opposing sides thereof. First and second track structures extend along the array axis and are coupled to respective ones of the first and second support terminations. The track structures each have an elongated portion for engaging and supporting respective ones of the vehicle wheels, whereby the vehicle travels along the tracks while carrying a solar panel, and at least a portion of the vehicle is disposed within the unobstructed spatial region. One of the tracks accommodates the wiring for the solar panel array.

16 Claims, 18 Drawing Sheets

(56) References Cited

U.S. PATENT DOCUMENTS

| | | | |
|---|---|---|---|
| 2010/0237028 A1* | 9/2010 | Cusson | F24J 2/465 |
| | | | 211/41.1 |
| 2010/0307479 A1* | 12/2010 | Park | F24J 2/38 |
| | | | 126/601 |
| 2011/0023864 A1* | 2/2011 | Andretich | 126/570 |
| 2011/0138599 A1* | 6/2011 | Bellacicco | F24J 2/5211 |
| | | | 29/428 |
| 2011/0284057 A1* | 11/2011 | Swahn et al. | 136/251 |
| 2013/0133172 A1* | 5/2013 | Kiener et al. | 29/428 |

* cited by examiner

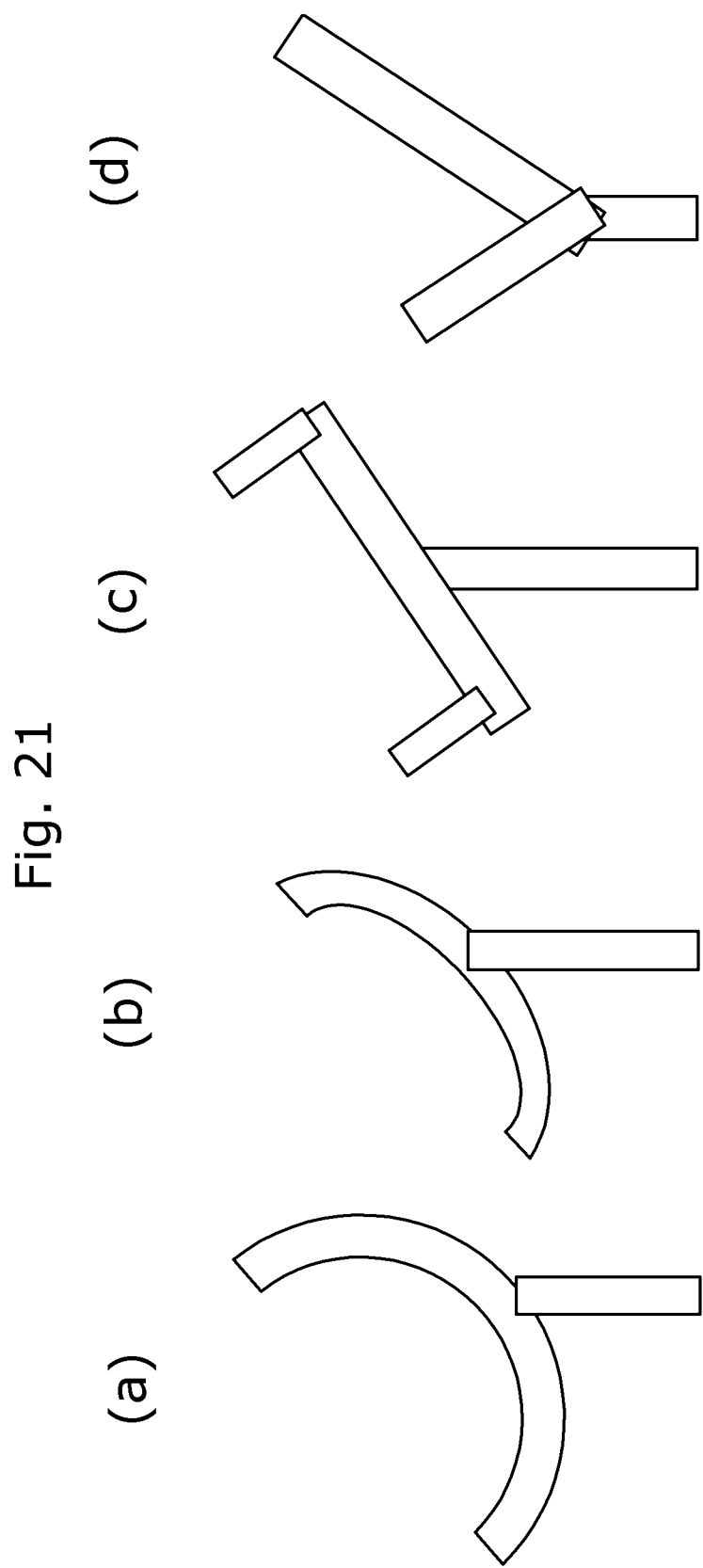

INSTALLATION SYSTEM FOR PHOTOVOLTAIC MODULES

RELATIONSHIP TO OTHER APPLICATION

This application claims the benefit of the filing date of U.S. Provisional Patent Application Ser. No. 61/509,471 filed Jul. 19, 2011, Conf. No. 3965 (Foreign Filing License Granted) in the names of the same inventors as herein. The disclosure in the identified United States Patent Application is incorporated herein by reference.

BACKGROUND OF THE INVENTION

Field of the Invention

This invention relates generally to systems for transporting and installing large photovoltaic modules, and more particularly, to a photovoltaic module handling system that does not require a conveyance vehicle to travel along the ground and that enables substantially automated and rapid replenishment of photovoltaic modules in a solar panel array.

Description of the Prior Art

Conventional solar panels typically are constructed using a plurality of photovoltaic cells that are electrically connected to one another in a series arrangement to form a large module. A typical solar panel of the type that is used industrially will weigh on the order of 120 kg, or more. Such large and heavy structures are heavier than a human individual alone can handle, requiring large equipment that travels back and forth in the array to replenish the supply of photovoltaic solar panels. This use of heavy equipment, however, damages the surface of the unprotected ground, requiring that grading and other procedures be employed to place the ground in condition for further use of the heavy equipment. The damage to the ground surface, coupled with rain and accumulated ground water, can easily increase the cost of operations and electrical production, and bring the project to a halt.

There is a need, therefore, for a system for installing, maintaining, and replacing solar panels that does not damage the ground surface.

There is additionally a need for a system for installing, maintaining, and replacing solar panels that does not require ongoing procedures that employ heavy equipment.

It is another problem with the state of the art that the population of racks with solar panels is a long and arduous process, causing inherent delays in bringing the solar panels on line. Delays in commencing the delivery of electrical power readily translate into lost revenue.

There is, therefore, a need for a system of bringing one or more arrays of solar panels quickly and efficiently into production.

Yet another problem with the current state of the art is that, since large and heavy equipment is required in the assembly of a solar panel array, the spacing between rows of such arrays must be large. Since space is generally at a premium in most solar farms, output power density, per unit of farm area, is unnecessarily low. Again, this underutilization of the solar farm land adversely affects the financial productivity of the project.

It is still another problem in the current state of the art that the use of heavy equipment requires associated workers to load and off-load the delicate solar panels. However, the solar panels are not only heavy, illustratively on the order of 250 lbs, they also are large, sometimes exceeding 3 m in length with a surface area approaching 6 $m^2$. The result is inefficiency and an unacceptable amount of module breakage.

The heavy equipment that typically is employed in the installation of a solar panel array includes cranes, boom trucks, and the like, as well as excavation equipment that is used to repair the ground to a condition in which such heavy equipment can be operated. Oftentimes, the crane will be operated blindly, wherein the operator receives direction from an observer by radio. Damage to the delicate solar panels is unacceptably common.

There is, therefore, a need for a system that safely handles and transports solar panels without the need for large equipment and that does not unduly tax the capabilities of human labor.

There is additionally a need for a system that does not require large equipment for replenishment of the solar modules, whereby the spacing between adjacent rows in a solar panel array is reduced, thereby increasing the power output density of the solar project.

SUMMARY OF THE INVENTION

The foregoing and other deficiencies in the current state of the art are addressed and overcome by this invention, which provides a solar panel array support system formed of a plurality of solar panels supported juxtaposed with one another along an array axis. In accordance with the invention, the solar panel array support system is provided with a support element having first and second support terminations disposed substantially orthogonal to the array axis. An unobstructed spatial region is formed intermediate of the first and second support terminations. In addition, a vehicle is provided for transporting the solar panels, the vehicle having first and second wheels arranged on opposing sides thereof. First and second track structures, each extend substantially parallel to the array axis and are coupled to a respective one of the first and second support terminations. The first and second track structures have a first elongated portion for engaging and supporting respectively associated ones of the first and second wheels.

In one embodiment, the vehicle is arranged to travel along the first elongated portions of the first and second track structures, at least a portion of the vehicle is disposed within the unobstructed spatial region intermediate of the first and second support terminations of the support element.

The vehicle is configured on a portion thereof distal from the portion of the vehicle that is disposed within the unobstructed spatial region intermediate of the first and second support terminations of the support element, to engage a solar panel and to transport same along the first and second track structures. The first and second track structures each have a second elongated portion for engaging and supporting the solar panel array.

There is further provided a latching arrangement on the vehicle for selectably grasping and releasing the solar panel. In one embodiment, the latch arrangement includes a solar panel lift arrangement. In a further embodiment, the vehicle is a motorized vehicle. At least one of the first and second track structures is provided with a third elongated portion for accommodating wiring of the solar panel array.

In accordance with a further embodiment, the solar panel array is formed of a plurality of solar panels supported juxtaposed with one another along an array axis, the solar panel array support system includes a support element having first and second support terminations disposed substantially orthogonal to the array axis, there is provided an unobstructed spatial region intermediate of the first and second support terminations. A vehicle transports the solar panels, the vehicle having first and second wheels arranged on opposing sides thereof. The wheels of the vehicle, in this embodiment, engage respective ones of the first and second track structures, each track structure extending substantially parallel to the array axis and being coupled to a respective one of the first and second support terminations, for engaging and supporting the solar panel array.

In accordance with a method aspect of the invention, there are provided the steps of:

installing an array support having first and second contact ends with an unobstructed spatial region therebetween;

installing an elongated support structure on each of the first and second contact ends;

mounting a solar panel on a vehicle;

urging the vehicle through the unobstructed spatial region; and depositing the solar panel on the elongated support structure.

In one embodiment of this method aspect of the invention, the step of mounting a solar panel on a vehicle includes the further step of actuating a gripper on the vehicle.

In a further embodiment, there is provided the step of entering into the vehicle information about the solar panel array.

In accordance with the invention, an inventive rack arrangement enables the carrying and transportation of an automated solar panel installation and removal system in the form of an automated drone. The rack arrangement is supported above ground by posts that are embedded in the ground using any conventional post embedment means. In a solar panel embodiment of the invention, a pair of east-west rails are supported in parallel relationship and at an angle that is at least in part responsive to the geographical location of the solar panel array. There is provided an arrangement that enables the east-west rails to be oriented at a desired angle relative to the southern horizon. The east-west rails are supported by frame elements that are configured to enable the passage of a solar panel carrier in the region between the frame elements and the east-west rails.

In an advantageous embodiment of the invention, there is provided a solar panel installation and removal system that in some embodiments of the invention collects the solar panels from a solar panel repository and conveys same to the location on the rack arrangement where the respective solar panel is to be installed. The solar panel installation and removal system includes, in some embodiments, an automated drone that effects the conveyance of the solar panels. In other embodiments, however, a manually operated dolly is employed. As is the case with the automated drone, the manually operated dolly will convey solar panel along the east-west rails of the rack arrangement. In addition, both forms of conveyances can be configured to carry accessories depending therefrom, such as cabling reels, maintenance supplies, tools, and the like.

There is additionally provided a subsystem within the automated solar panel installation and removal system for enabling automated or semi-automated pick-up of the solar panels by the automated drone at a source of solar panels. Of course, such a system facilitates automated or semi-automated removal of the solar panels from the automated drone.

As stated, the rack arrangement is configured to permit travel along the east-west rails by an automated drone or a manually operated drone, with or without a solar panel thereon, and in some instances, with an accessory depending therefrom. In a highly advantageous embodiment of the invention the supporting structure for the east-west rails has a semicircular configuration. In other embodiments, however, such supporting structure is configured as a shallow arc, or other geometric configuration, such as a rectilinear arrangement in which the east-west rails are supported on respective stanchions, or purlins, or a triangular configuration, in which the east-west rails are supported on respective ones of two of the legs of the triangle.

In practical embodiments of the invention, the east-west rails are permitted to tilt between 5° and 35° in predetermined angular increments, illustratively 5°. The rack arrangement in some embodiments will support loads of typically 1800 Pa (37.6 psf), and higher.

In operation, the following steps are followed in some embodiments of the invention:

solar panels are assembled at a stacker station;

the next solar panel to be installed (the ready panel) is moved to a dock station;

the automated drone arrives at the dock station, raises the solar panel to a lift position, and engages solar panel grippers;

the automated drone computes the distance to the next installation location;

the automated drone accelerates to cruising speed and travels to a computed deceleration point;

while the automated drone is traveling and is away from the docking station, a subsequent ready solar panel is moved into the docking station;

the automated drone decelerates to the installation location;

servos on the automated drone, with the use of fine datum, causes the automated drone to park at the installation location;

the automated drone lowers the solar panel to a lock position;

the solar panel is held securely in the lock position and is fastened to the rack arrangement;

the automated drone disengages the solar panel grippers and lowers the lift to a release position;

the automated drone computes the distance to the dock station;

the automated drone accelerates to cruising speed and travels to a determined deceleration point;

the automated drone decelerates to the dock station;

the servos on the automated drone, with the use of fine datum, cause the automated drone to park at the dock station; and the sequence is repeated.

In some embodiments of the invention, a solar panel farm is populated from one end of each row of solar panels. Delivery of the solar panels is powered by the automated drone, which in some embodiments is fully electric, and in other embodiments, employs gas-electric propulsion. In small installations, a manually operated dolly is used for conveying the solar panels. However, in some large installations, the automated drone serves as a locomotive that propels one or more manually operated dollies in train-like fashion as non-powered carriers of solar panels.

In a practicable embodiment of the invention, the automated drone weighs ~30 kg and is able to carry a load of ~120 kg. The automated drone has two or more drive wheels that have associated brakes. The drive system that is employed in the practice of the invention will depend on a variety of factors, such as system cost, availability of fuel, terrain, etc. Generally, the various embodiments of the system are driven either directly, using on-board electric or internal combustion drive, or indirectly, using a cable or the like, wherein a motor is installed at one or both ends of the rack.

The automated drone has a lift system having, in some embodiments of the invention, three functional positions, specifically release, lock, and lift. In the lift mode, the solar panel is lifted to facilitate travel along the rack arrangement. The lock mode is applied to bring the solar panel into position for securement thereof onto the rack arrangement. Additionally, the release mode serves to remove the solar panel carrier from communicating with the solar panel.

The automated drone is, in some embodiments, protected by a bumper, and is additionally provided with a plurality of safety and collision avoidance systems with respectively associated sensors. In some embodiments, the automated drone has human accessible controls thereon that enable an operator to control various aspects of the operation of the system. Other features that are included in some embodiments of the invention include a connection panel for accessing and delivering data, a user-accessible battery compartment, and an audible warning (sound emitting) device.

In embodiments of the invention where an automated drone is applied as a solar panel installation robot, the automated drone's operation is in some embodiments, manually programmed with a set of parameters that include direction of travel (i.e., origin east or west), solar panel pitch, number of solar panels, and the location and distance of dead spaces where no solar panels are to be installed (e.g., temporary bridges between rows of the array). This manner of programming an automated drone can be time consuming and error prone.

In other embodiments, however, the automated drone is self-teaching, as follows:

the automated drone is placed on the rack arrangement at the end thereof where the load station is located (i.e., several inches past the first relative solar panel position from the side of the solar panel loader;

end stops are placed at each end of the east-west rails of the rack arrangement;

the automated drone then is activated so as to function as a transport;

the automated drone is initialized with the use of a push button on the mechanical interface of the automated drone;

the automated drone then:

checks the east and west optical sensors to determine the location of the load station;

moves toward the end station until the south facing optical sensor detects the datum mark for the first solar panel; and records the position of the first solar panel location as zero;

the automated drone commences motion away from the load station;

as the south sensor is triggered by a datum mark on the south purlin, the location of the datum mark is recorded, and the total number of datum marks are recorded.

The automated drone continues until one of the following conditions is met:

when the end mark at the opposite side of the rack arrangement is encountered and detected by an east/west optical sensor, the automated drone slows and executes a stop at the end of the rack arrangement, while continuing to record datum mark locations and increment the total number of datum marks;

when a solar panel is detected by an upward facing sensor in combination with the detection of a datum mark by a south sensor, the automated drone comes to a halt, and does not record the last datum mark (for use in mapping a partially populated array).

The automated drone then returns to the load station with the location of all of the solar panels that will be mounted onto the rack arrangement, the total length of the rack arrangement, and the total number of solar panels that are to be installed.

In some embodiments of the invention, the automated drone functions as a transport and contains the following features:

a programmable CPU;

a mechanical interface consisting of pushbuttons, indicator lights, and a power switch;

optical sensors installed on the east and west sides of the automated drone;

a motor encoder or optical encoder for providing closed-loop information that enables accurate location information to be monitored and recorded;

an optical sensor on the south side of the automated drone for determining the location of periodically disposed datum marks (typically in the form of slots); and an upward facing optical sensor on the top of the automated drone for determining whether a panel location is occupied by a solar panel.

In some embodiments, a rack arrangement is provided for mounting the solar panels, the rack arrangement having the following features:

a track in which the automated drone rides in the east/west direction;

removable end stops on which are mounted reflectors for the optical sensors that are mounted on the east and west sides of the automated drone; and registration marks on the south purlin indicating locations of the solar panels;

a load station disposed on the east or west sides of the rack arrangement, the load station having a means for placing the solar panels on the rack arrangement;

a program for operating the automated drone.

BRIEF DESCRIPTION OF THE DRAWING

Comprehension of the invention is facilitated by reading the following detailed description, in conjunction with the annexed drawing, in which:

FIGS. 21(*a*), 21(*b*), 21(*c*), and 21(*d*) show respective illustrative 180° arc, shallow arc, raised purlins, and triangular configurations that can be used in respective embodiments of top portions of the rack arrangement of the present invention.

DETAILED DESCRIPTION

Figure 1:
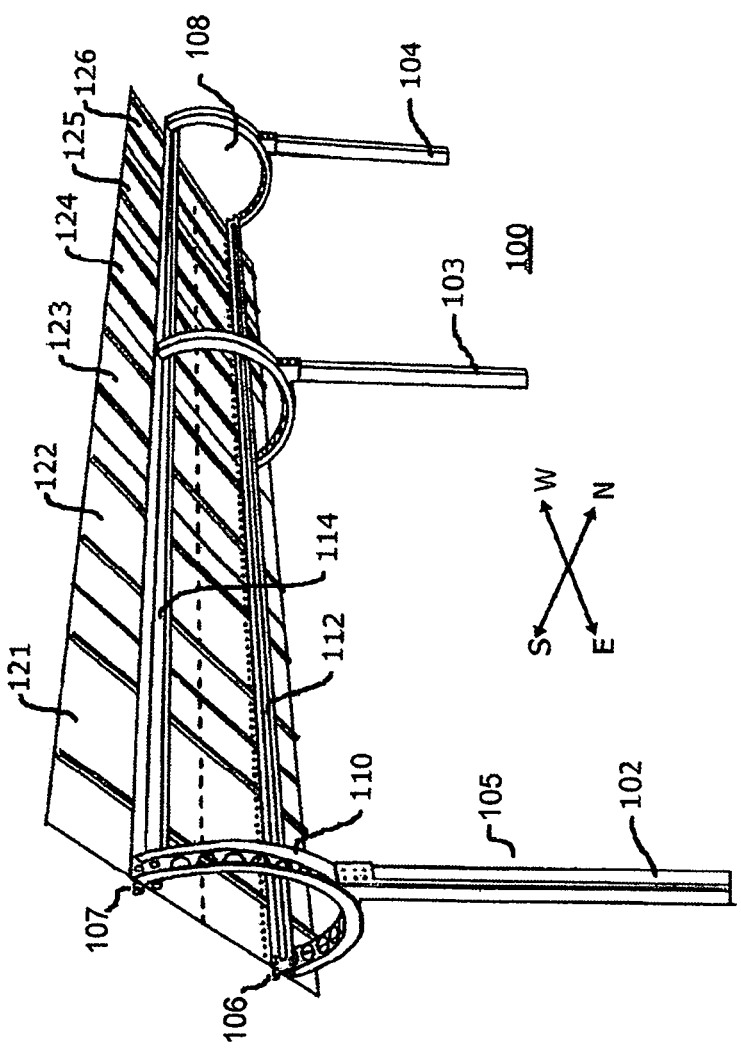
FIG. 1 is a simplified perspective representation of a rack arrangement that is useful in the practice of a specific illustrative embodiment of the invention.

FIG. 1 is a simplified perspective representation of a rack arrangement 100 that is useful in the practice of a specific illustrative embodiment of the invention. As shown in this figure, rack arrangement 100 is formed of a plurality of aligned support stanchions 102, 103, and 104 in this embodiment of the invention. The support stanchions are firmly embedded in the ground (not specifically designated) so as to maintain a fixed spatial relation relative to each other.

Referring to support stanchion 102, which is in large measure identical to the others, there is seen in the figure an upper portion 110, which in this specific illustrative embodiment of the invention has a semicircular configuration with substantially 180° of arc. It is to be understood, however, that the practice of the invention is not limited to this semicircular configuration of the top portion. Other configurations, such as a shallow arc (not shown), a rectilinear arrangement of support purlins (not shown), or a triangular configuration (not shown), can be used in the practice of the invention. As a result of the configuration of upper portion 110, support element 105 has first and second support terminations. An unobstructed spatial region 108 is formed between the first and second support terminations.

The distal ends 106 and 107 of the first and second support terminations comprising upper portion 110 are coupled to respective ones of longitudinal tracks 112 and 114 that, in the installation of a practical embodiment, are arranged to extend in the east/west direction. The distal ends of upper portion 110, in such a practical embodiment, are directed generally south.

As shown in FIG. 1, rack arrangement 100 comprises a plurality of support elements that have first and second track structures 112 and 114 attached to the distal ends of the upper Portions 110 of successive support stanchions 102-104 to form a frame for engaging and supporting the solar panel array. The figure shows that there are in this specific illustrative embodiment of the invention a plurality of solar panels 121-126 installed on longitudinal tracks 112 and 114.

Figure 2:
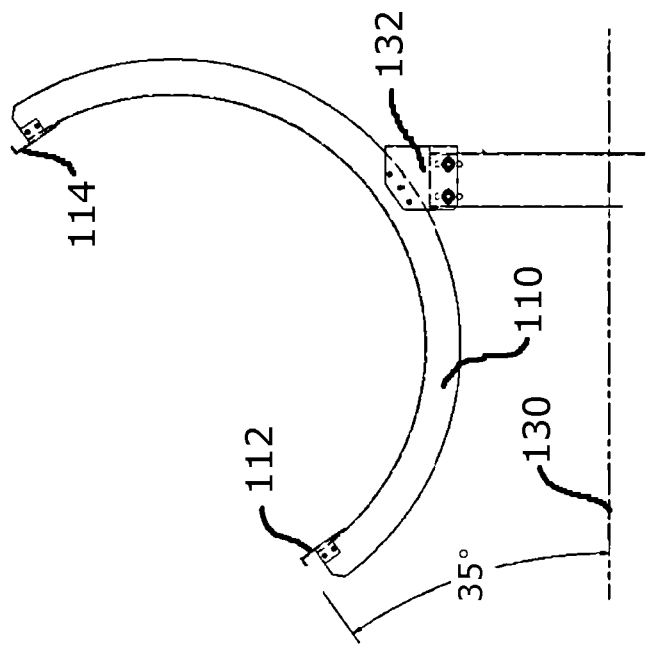
FIG. 2 is a simplified side plan representation of the embodiment of FIG. 1.

FIG. 2 is a simplified side plan representation of the embodiment of FIG. 1. As shown in this figure, upper portion 110 is oriented so as to form a 35° angle relative to a ground plane 130. As previously noted, upper portion 110 and rails 112 and 114 are permitted to tilt between 5° and 35° in predetermined angular increments, illustratively 5°. This is achieved, in this embodiment by modifying the geometry of coupler 132, which connects upper portion 110 to support stanchion 102.

Figure 3:
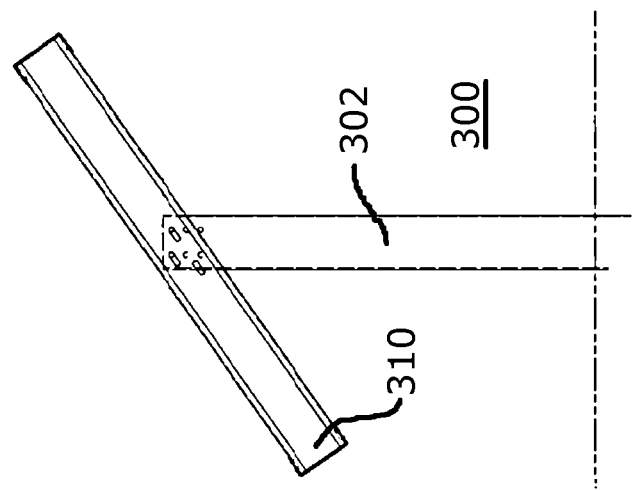
FIG. 3 is a simplified side plan representation of a prior art rack arrangement.

FIG. 3 is a simplified side plan representation of a prior art rack arrangement 300. As seen in this figure, support stanchion 302 is coupled to upper portion 310 by fasteners (not specifically designated) that engage arcuate apertures (not specifically designated). This combination of fasteners and arcuate apertures enables a limited amount of adjustment of the tilt of upper portion 310. As will become evident hereinbelow, this prior art arrangement is incapable of utilizing the automated drone of the present invention.

Figure 4:
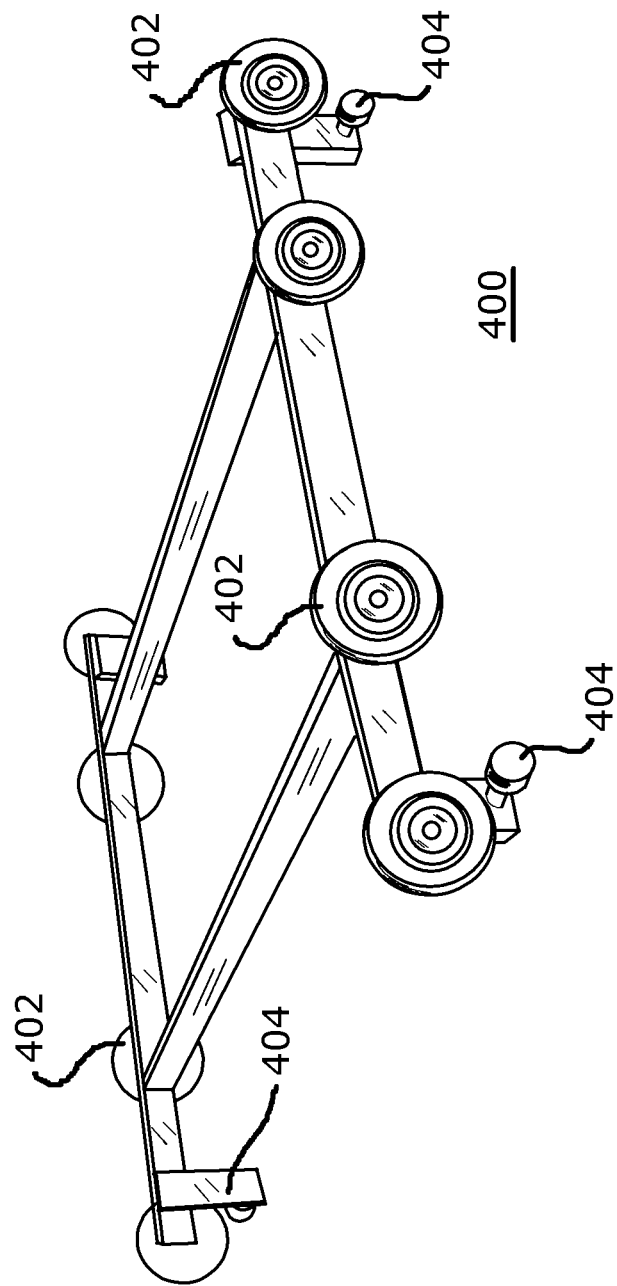
FIG. 4 is a simplified perspective representation of a manually operated dolly that is useful in the conveyance of solar panels in one embodiment of the invention.

FIG. 4 is a simplified perspective representation of a manually operated dolly 400 that is useful in the conveyance of solar panels (not shown in this figure) in one embodiment of the invention. Manually operated dolly 400 is shown to have a plurality of wheels 402 that travel along respective ones of longitudinal tracks 112 and 114 (not shown in this figure). There are additionally provided anti-derailment wheel arrangements 404 that prevent the manually operated dolly from leaving the longitudinal tracks, as will be described below.

Figure 5:
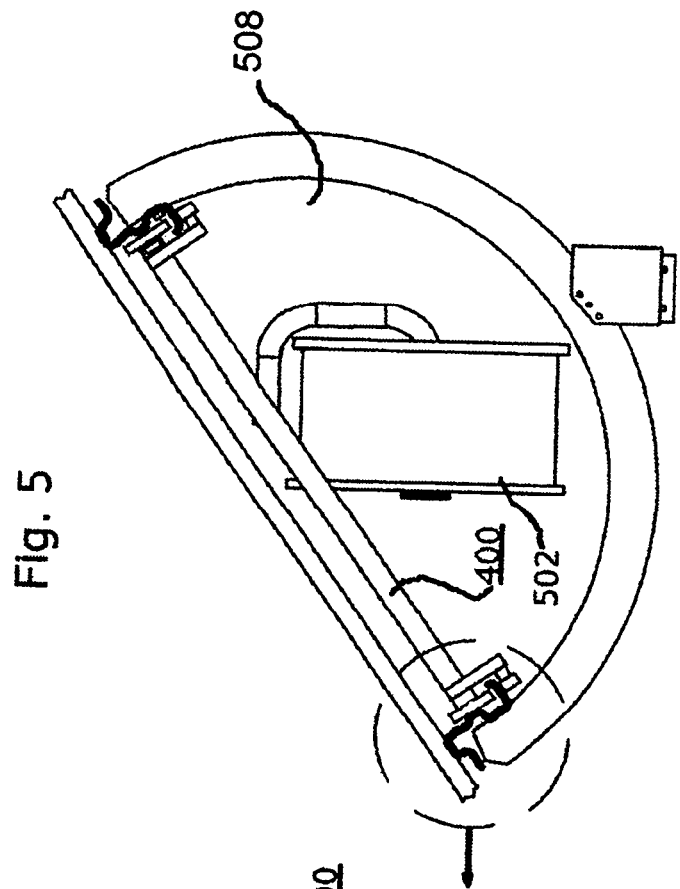
FIG. 5 is a simplified side plan representation of a rack arrangement constructed in accordance with the principles of the invention and showing an advantageous feature of the invention in that a dolly is able to transport accessories along the rack in addition to a solar panel, specifically in this embodiment, a cable reel.

FIG. 5 is a simplified side plan representation of the rack arrangement constructed in accordance with the principles of the invention and showing an advantageous feature of the invention in that manually operated dolly 400, or an automated drone (not shown in this figure), is able to transport accessories along the rack through unobstructed spatial region 508, specifically in this embodiment, a cable reel 502, in addition to a solar panel. The engagement between manually operated dolly 400 and longitudinal track 112 is shown in greater detail in FIG. 6.

Figure 6:
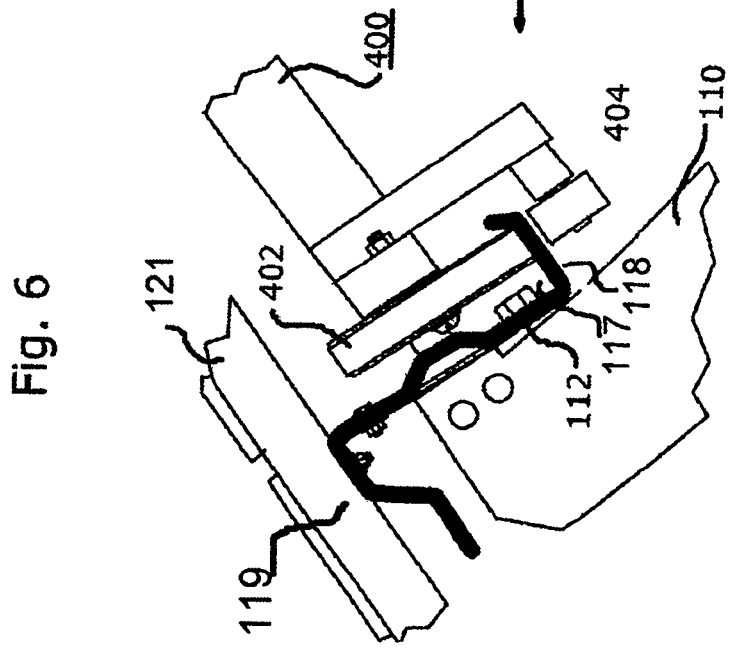
FIG. 6 is an enlarged representation of an identified portion of the embodiment of FIG. 5, showing certain features related to the mounting of the dolly on the rack arrangement.

FIG. 6 is an enlarged representation of the identified portion of the embodiment of FIG. 5, showing certain features related to the mounting of manually operated dolly 400 on longitudinal track 112 of the rack arrangement. As shown in this figure, wheel 402 communicates with an interior surface of a first elongated portion 116 of track 112. Anti-derailment wheel 404 communicates with an outside surface of longitudinal track 112 and counteracts any force that would tend to separate the dolly from the longitudinal track. A solar panel (e.g., solar panel 121) engages and is supported on a second elongated portion 119 of longitudinal track 112. As shown best in FIG. 5, the dolly, as well as any accessories, can easily travel on track 112 underneath pre-installed panels.

Figure 7:
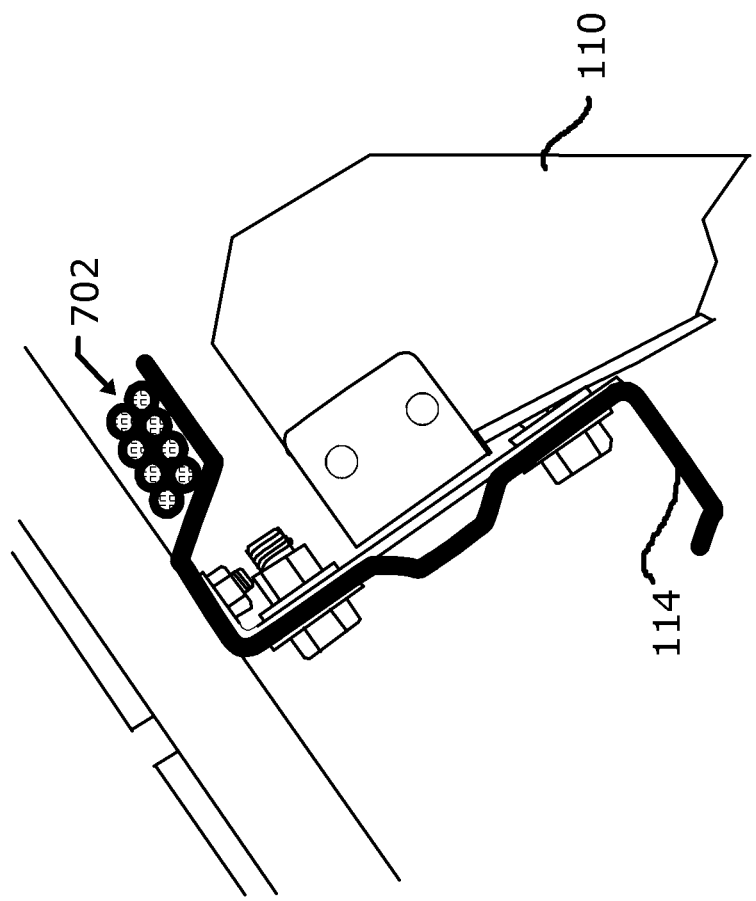
FIG. 7 is an enlarged representation of a further portion of the embodiment of FIG. 5, distal from the identified portion of FIG. 6, showing certain features related to the mounting of the dolly on the rack arrangement as well as an advantageous feature of the invention relating to the location of system cabling.

FIG. 7 is an enlarged representation of a further portion of the embodiment of FIG. 5, distal from the identified portion of FIG. 6, showing certain features related to the mounting of the dolly on the rack arrangement as well as an advantageous feature of the invention relating to the location of system cabling 702. This arrangement enables system cabling or re-cabling to be performed at any time irrespective of whether the array has or has not been populated.

Figure 8:
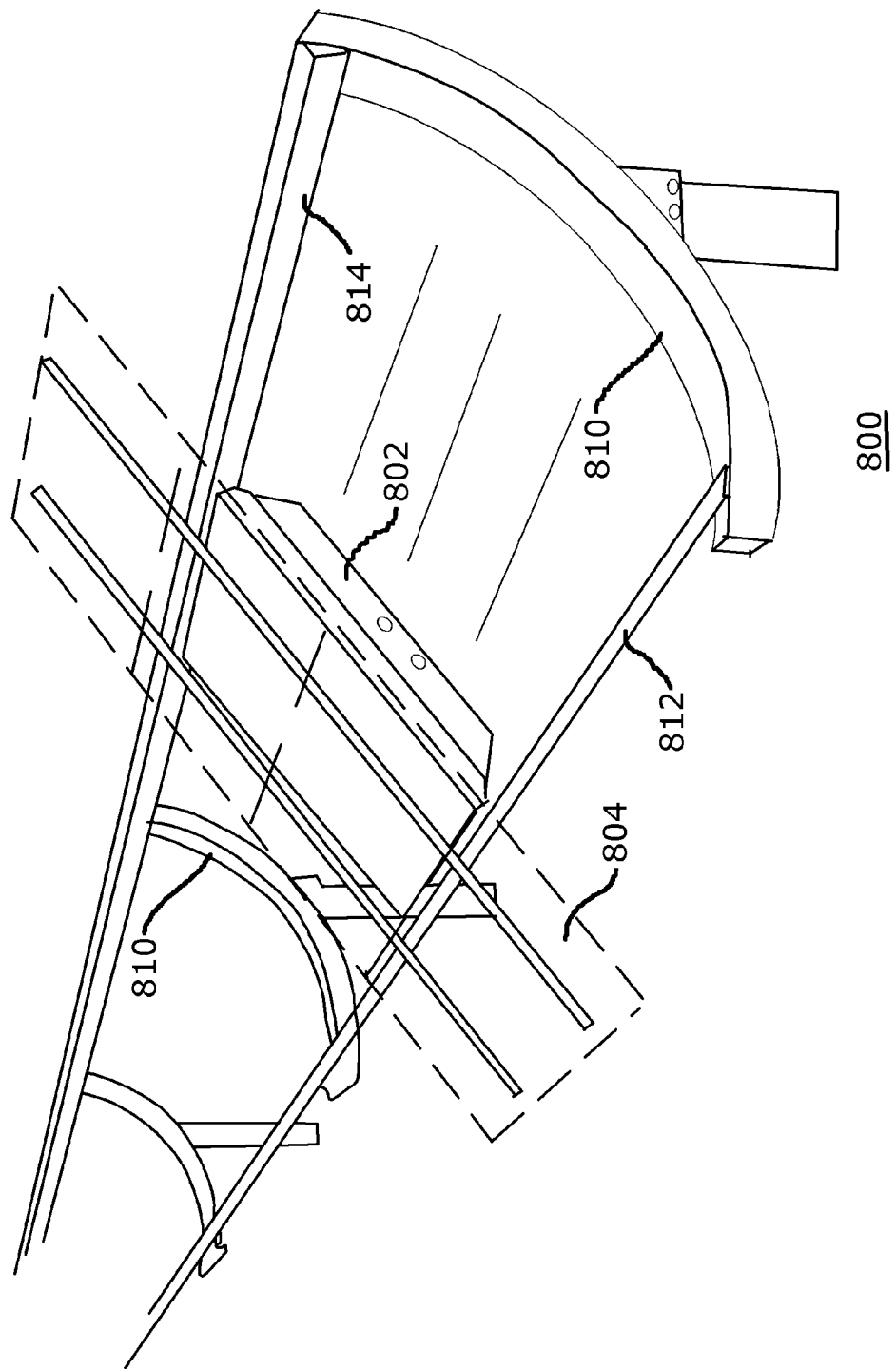
FIG. 8 is a simplified perspective schematic representation of a rack arrangement constructed in accordance with the principles of the invention showing a powered drone transporting a solar panel along the rack arrangement.

FIG. 8 is a simplified perspective schematic representation of a rack arrangement constructed in accordance with the principles of the invention showing a powered drone 802 transporting a solar panel 804 (shown in phantom) along longitudinal tracks 812 and 814 of a rack arrangement 800. The longitudinal tracks extend parallel to the axis of the elongated array (not specifically designated). Rack arrangement 800 is unlike rack arrangement 100 in that rack arrangement 800 has upper portions 810 that are configure as shallow arcs, rather than complete semicircles. In this embodiment, powered drone 802 travels along longitudinal tracks 812 and 814, and is engaged therewith, as will be described below. Powered drone 802 of this embodiment is not necessarily fully automated as previously described, and in such embodiments, serves as an assistant to human labor (not shown).

Figure 9:
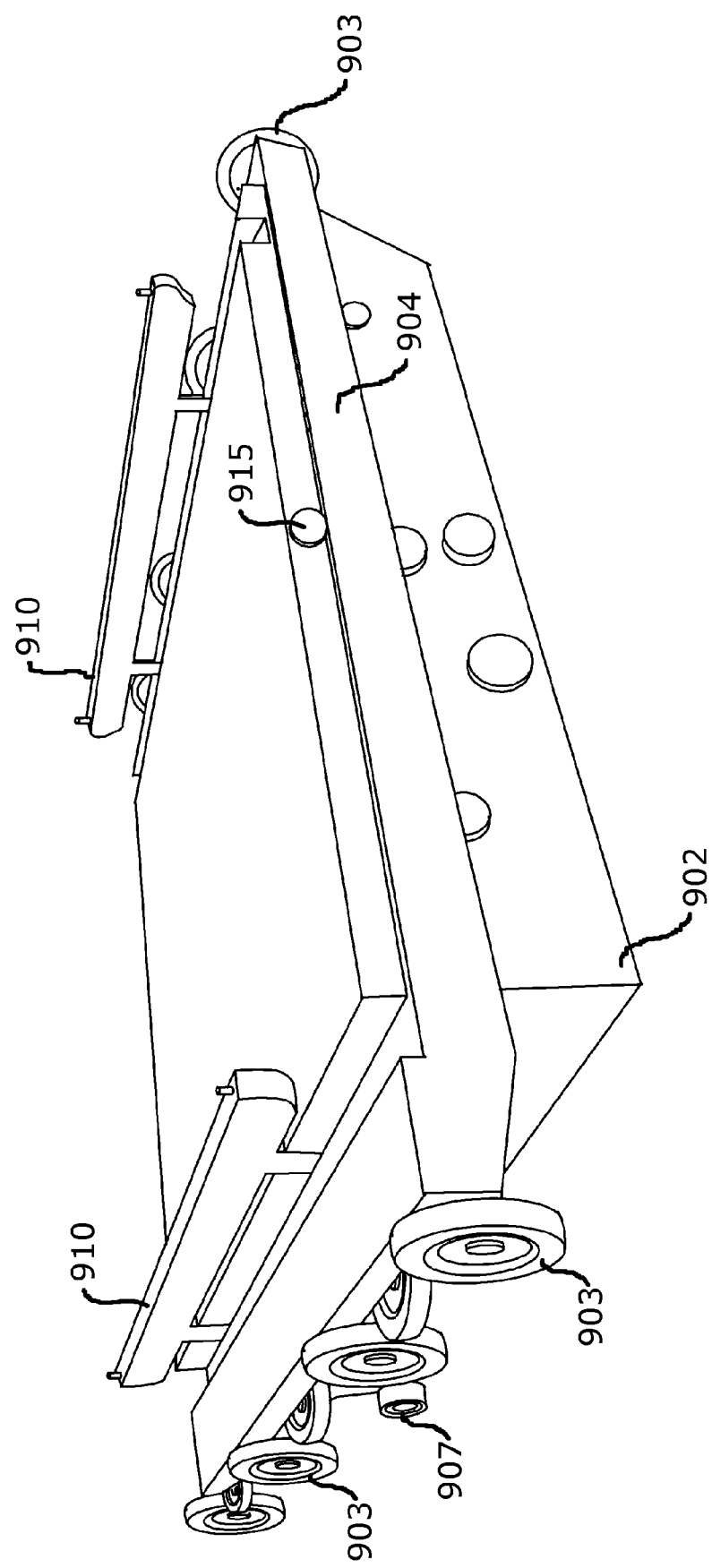
FIG. 9 is a simplified perspective representation of the drone that is shown in simplified form in FIG. 8.

FIG. 9 is a simplified perspective representation of the drone 902 that is shown in simplified form in FIG. 8. Elements of structure that have previously been discussed are similarly designated. In the embodiment of FIG. 9, drone 902 is provided with features of automation that need not be present in every embodiment of the invention. More specifically, drone 902 is an embodiment that is provided with two wheel drive (not shown) that exerts propulsion via selected ones of wheels 903. Derailment is avoided with the use of an anti-derailment wheel 907.

The drone is shown to have a protective bumper 904 that additionally provides handling points (not specifically designated). In this embodiment, drone 902 has incorporated therein a solar panel lift system 910 that has three positions of actuation, specifically release, lock, and lift. As noted above, in the lift mode, the solar panel (not shown in this figure) is lifted to facilitate travel along the rack arrangement. The lock mode is applied to bring the solar panel into position for securement thereof onto the rack arrangement. The release mode serves to remove the solar panel carrier from engagement with the solar panel.

Drone 902 is provided in this embodiment with a docking sensor 915 that serves to avoid collisions. A plurality of other sensors are provided for reading datum marks, and determining the presence of objects or persons in the path of travel. In some embodiments, the sensors are a vision system that has an on board camera (not shown) that collects real time images of the drone's area of operation. In some embodiments, the image is filtered so as to highlight potential collision objects. Stored within drone 902 are procedures that are effective to stop the travel of drone 902 in response to signals from the sensors or the vision system.

It is to be noted that the determination of drone position along the rack is not limited to the reading of datum marks. In some embodiments, GPS or a localized radio beacon are useful in determining the drone's location.

Collisions are avoided in some embodiments of the invention with the use of the vision system. However, other systems and strategies can be used in the practice of the invention. One such system is in the form of a light curtain that consists of a plurality of overlapping lasers and sensors that are placed on both sides of the track (not shown in this figure) to provide a signal responsive to entry into the area of interest by objects or persons. The use of lasers enables detection of objects having dimensions less than 30 mm, resulting in immediate execution of the emergency stop procedures. In addition, in some embodiments, the loss of communication between the light curtain and the drone will trigger the execution of the emergency stop procedures. Emergency stopping requires that the drone be equipped with a braking system, that in its various implementation includes drum brakes, disc brakes, or an other braking arrangement, such as reversing or back driving an electric motor.

In some embodiments, safety is enhanced by an ultrasonic sensor, or other form of ranging sensor, that is useful to determine the distance between the drone and interfering objects. When objects are identified to be present in the path of the drone, or within a predetermined distance, the emergency stop procedures are initiated. However, the use of symmetrically disposed sensors reduces incidences of false positives. For example, symmetrical obstructions that trigger the symmetrical sensors simultaneously are ignored, as they represent structural elements of the rack arrangement. Instead, such simultaneous triggering events are counted, in some embodiments, for drone positioning purposes.

Figure 10:
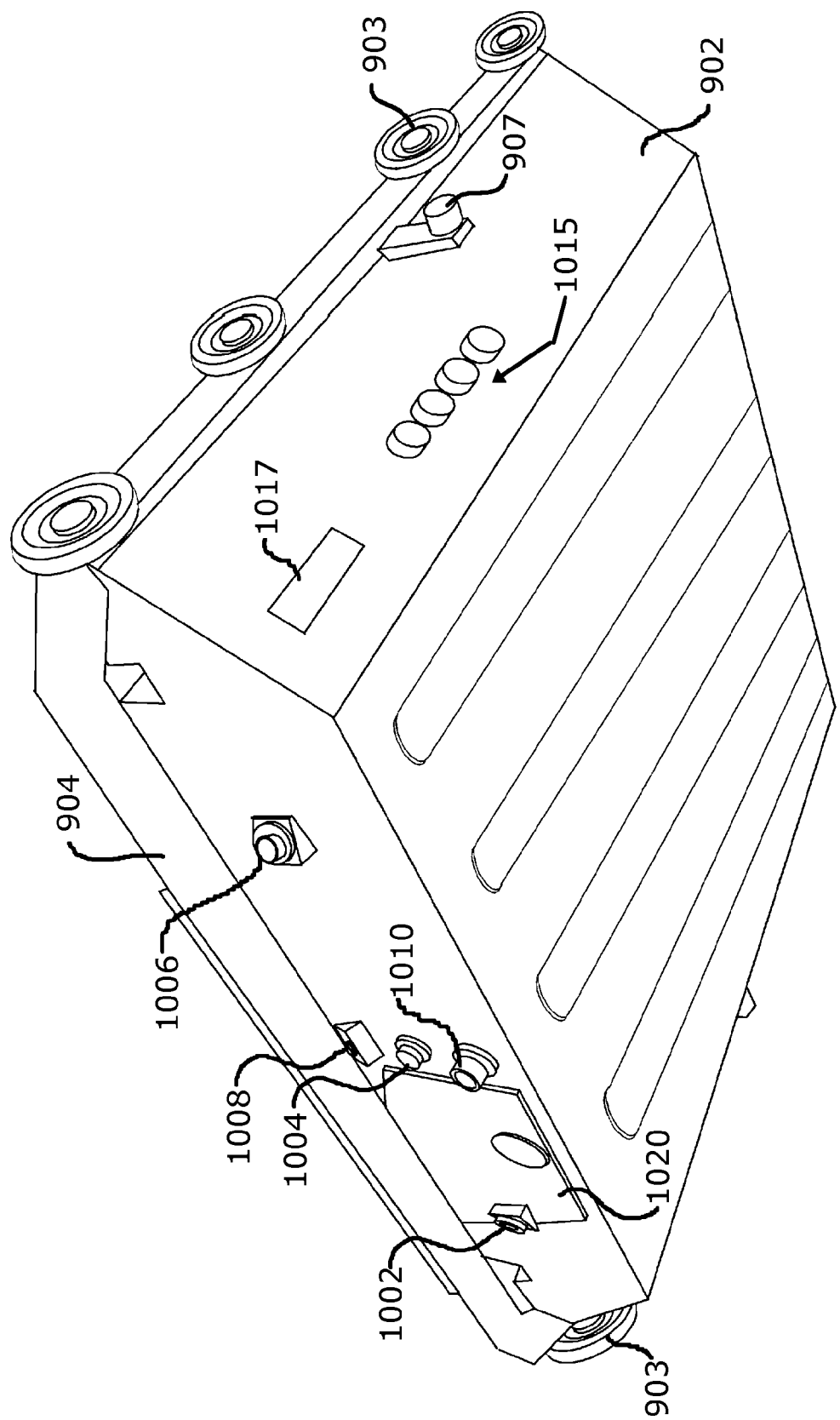
FIG. 10 is a simplified perspective representation of the drone that is shown in FIG. 9.

FIG. 10 is a simplified perspective representation of drone 902 that is shown in FIG. 9. Elements of structure that have previously been discussed are similarly designated. This figure depicts the location of collision avoidance ultrasonic sensors 1002, 1004, and 1006. An upward looking sensor 1008 determines whether a solar panel is present on the drone. In this embodiment, there is additionally provided a sound emitting device 1010 that provides audible warning of the proximity of the drone.

The figure additionally shows manually operable operator controls 1015 by which an operator can enter commands manually. These human accessible controls enable an operator (not shown) to control various aspects of the operation of the system. Commands can also be entered in this embodiment with the use of a computer connection panel 1017 that includes USB and other forms of computer interconnection.

One or more batteries are stored in this embodiment of the invention behind a battery compartment door 1020. In some embodiments, there is provided a battery charging system (not shown) that includes any of an internal gas powered DC generator (not shown), or an AC generator (not shown) with an AC to DC converter (not shown). Some embodiments utilize an uninterruptible power supply (UPS) (not shown) that provides continuous power to a control system (not shown). A UPS ensures that stored information is not lost when power is lost, and reduces the start-up time. In some embodiments, power can be delivered via hardwired electrical connection that is deployed as the drone is moved.

Figure 11:
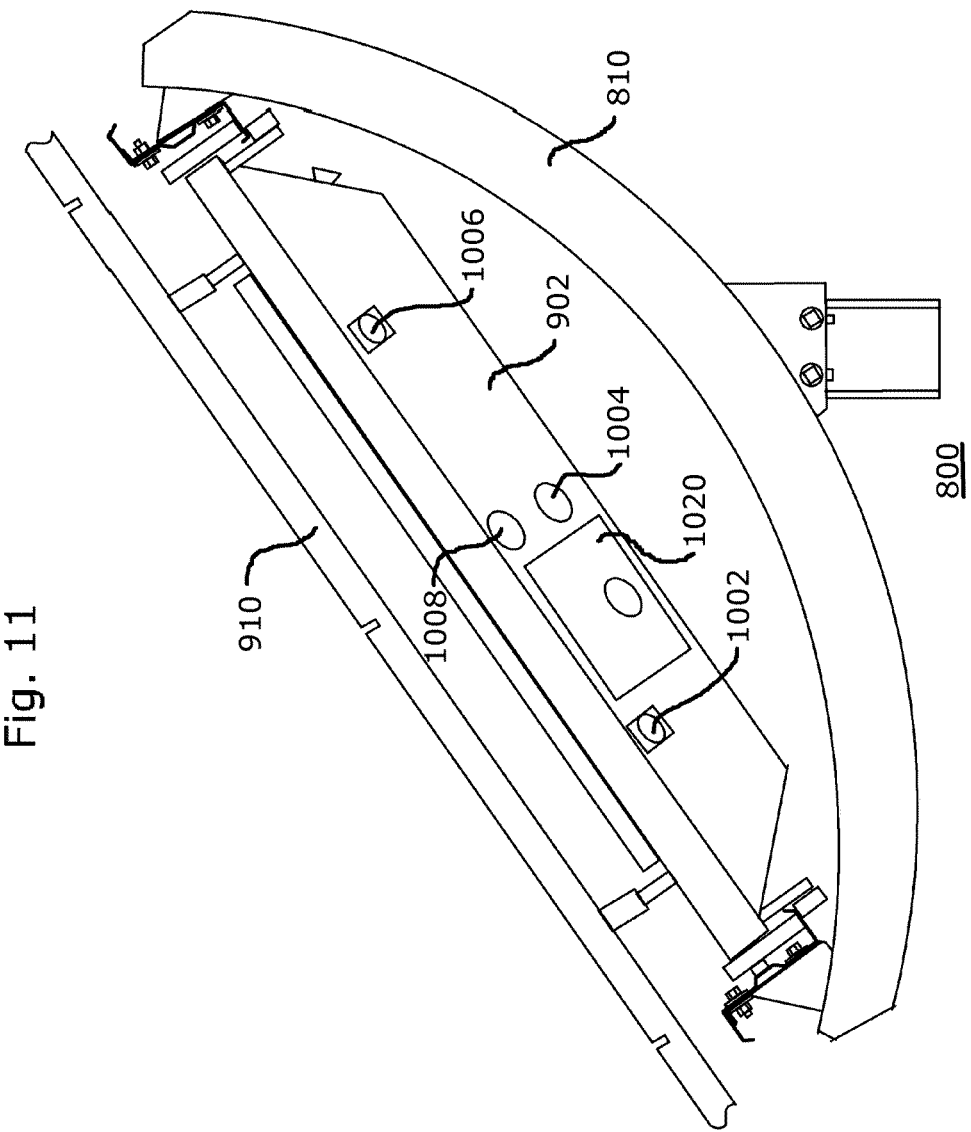
FIG. 11 is a simplified side plan representation of the drone of FIGS. 9 and 10 installed on a rack arrangement.

FIG. 11 is a simplified side plan representation of the drone of FIGS. 9 and 10 installed on a rack arrangement.

Elements of structure that have previously been discussed are similarly designated. In this figure, drone 902 is shown installed on a shallow arc rack arrangement, as described above in connection with FIG. 8.

Figure 12:
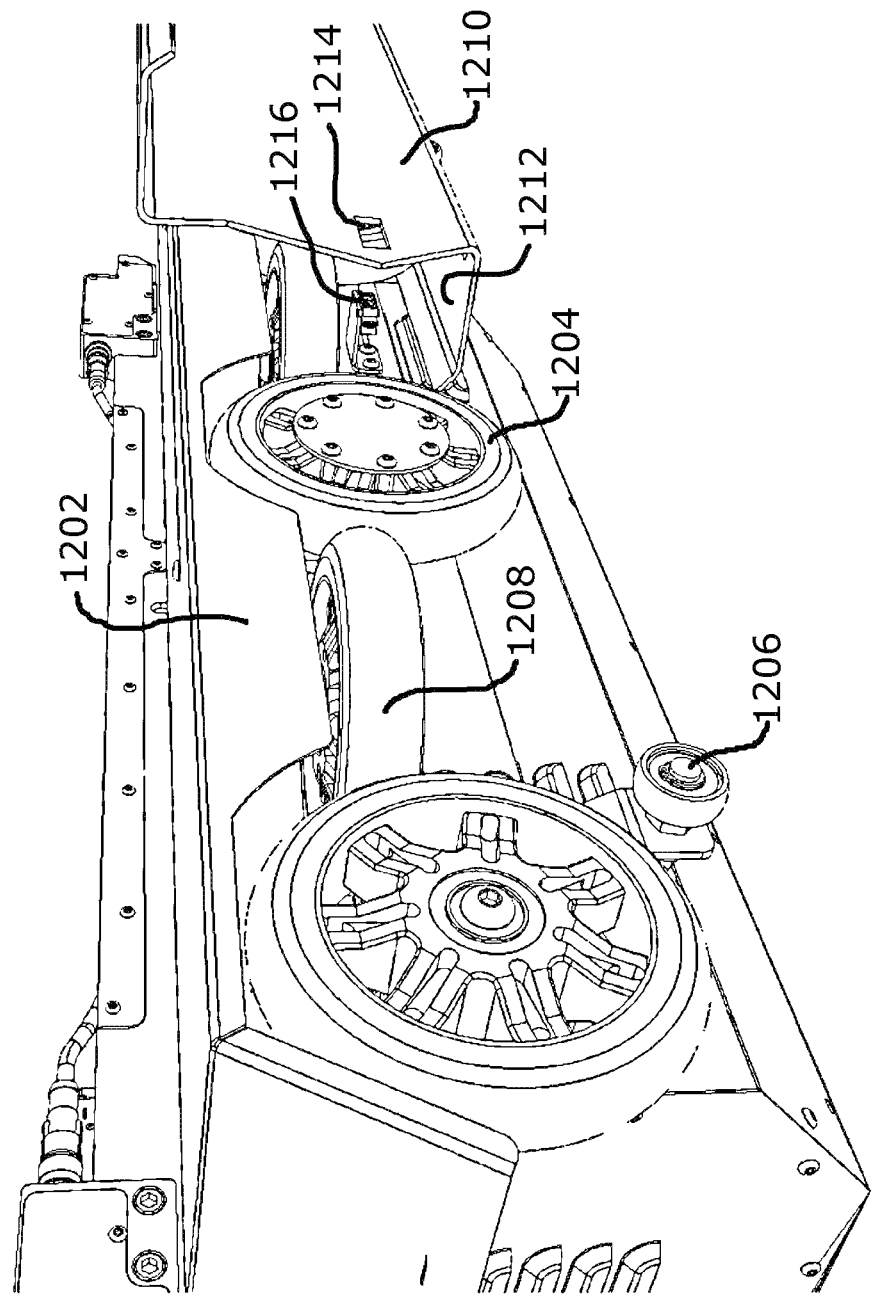
FIG. 12 is a simplified partially fragmented perspective representation of an embodiment of a drone, the figure illustrating the manner in which the drone engages with the rack arrangement.

FIG. 12 is a simplified partially fragmented perspective representation of an embodiment of a drone 1202, the figure illustrating the manner in which the drone engages with rack arrangement 1210. Wheel 1204 of drone 1202 rolls on upper track surface 1212 of rack arrangement 1210. While wheel 1204 communicates with upper track surface 1212, an anti-derailment wheel 1206 communicates with the underside (not shown in this figure) of rack arrangement 1210. A lateral wheel 1208 communicates with the upstanding interior surface (not shown in this figure) of rack arrangement 1210. The lateral wheel prevents lateral scraping of drone 1202 as it travels along the interior of the rack arrangement.

FIG. 12 additionally shows the manner by which some information is transferred from rack arrangement 1210 to drone 1202. In this specific illustrative embodiment of the invention, rack arrangement 1210 has a datum mark 1214 thereon that is recognized by a sensor 1216 on drone 1202.

Figure 13:
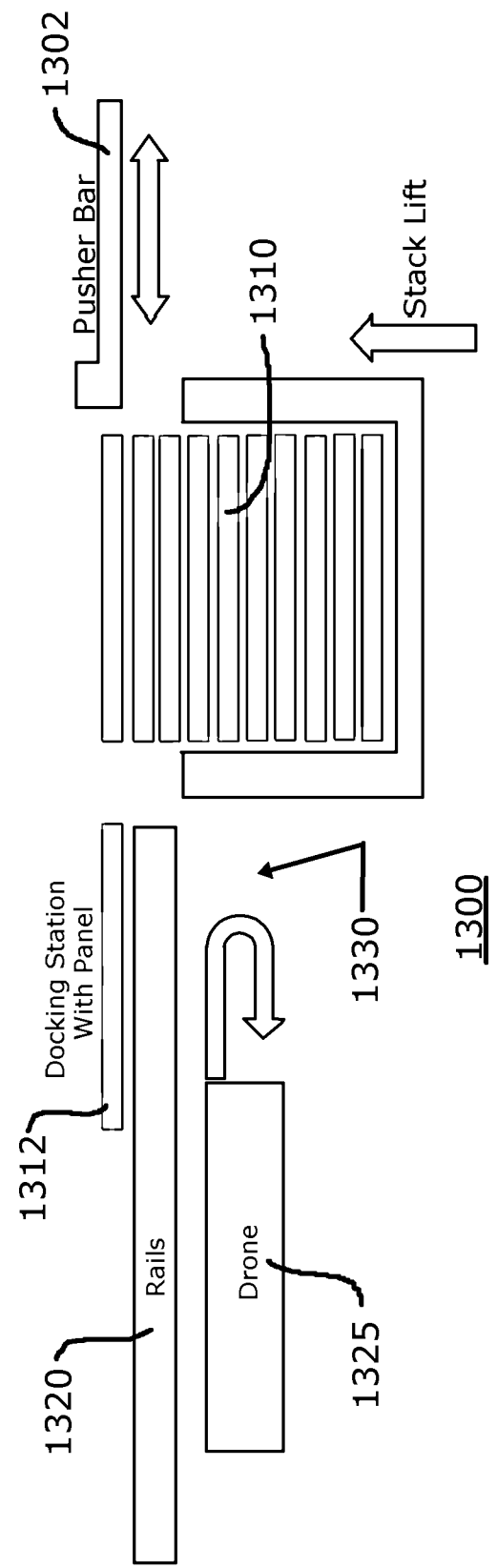
FIG. 13 is a simplified schematic representation of a vertical stack loader arrangement that employs a pusher bar and that feeds solar panels, in this specific illustrative embodiment of the invention, from beneath.

FIG. 13 is a simplified schematic representation of a vertical stack loader arrangement 1300 that employs a pusher bar 1302 that feeds solar panels 1310, in this specific illustrative embodiment of the invention, from beneath. A solar panel 1312 is shown to have been deposited onto the rails 1320 of the rack arrangement (not shown in this figure), which is disposed immediately superior to drone 1325. The arrow shows that drone 1325 will approach docking station region 1330, and will then return in the reverse direction to deliver or pick-up a solar panel.

Fundamentally, a stack loader arrangement aggregates the solar panels in a form that facilitates loading thereof onto the drone. As such, therefore, it avoids excessive time being spent of the solar panel hand-off, since the next solar panel to be delivered is deposited on the docking station while the drone is installing (deploying) or removing a solar panel from the array (not shown).

Figure 14:
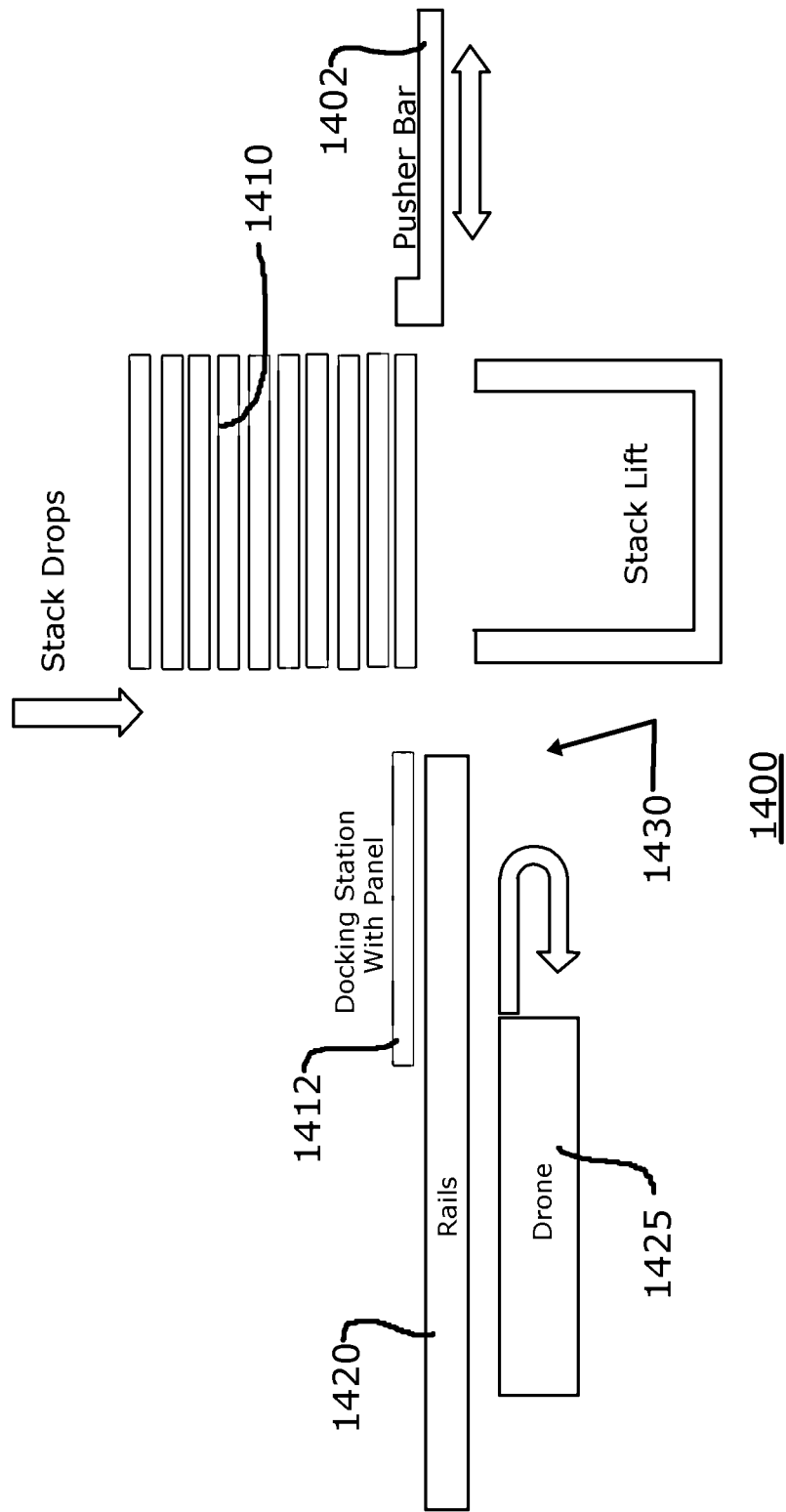
FIG. 14 is a simplified schematic representation of a vertical stack loader arrangement that employs a pusher bar and that feeds solar panels, in this specific illustrative embodiment of the invention, from above.

FIG. 14 is a simplified schematic representation of a vertical stack loader arrangement 1400 that employs a pusher bar 1402 and that feeds solar panels 1410, in this specific illustrative embodiment of the invention, from above. A solar panel 1312 is shown to have been deposited onto the rails 1420 of the rack arrangement (not shown in this figure), which is disposed immediately superior to drone 1425. The arrow shows that drone 1425 will approach docking station region 1430, and will then return in the reverse direction to deliver or pick-up a solar panel.

Figure 15:
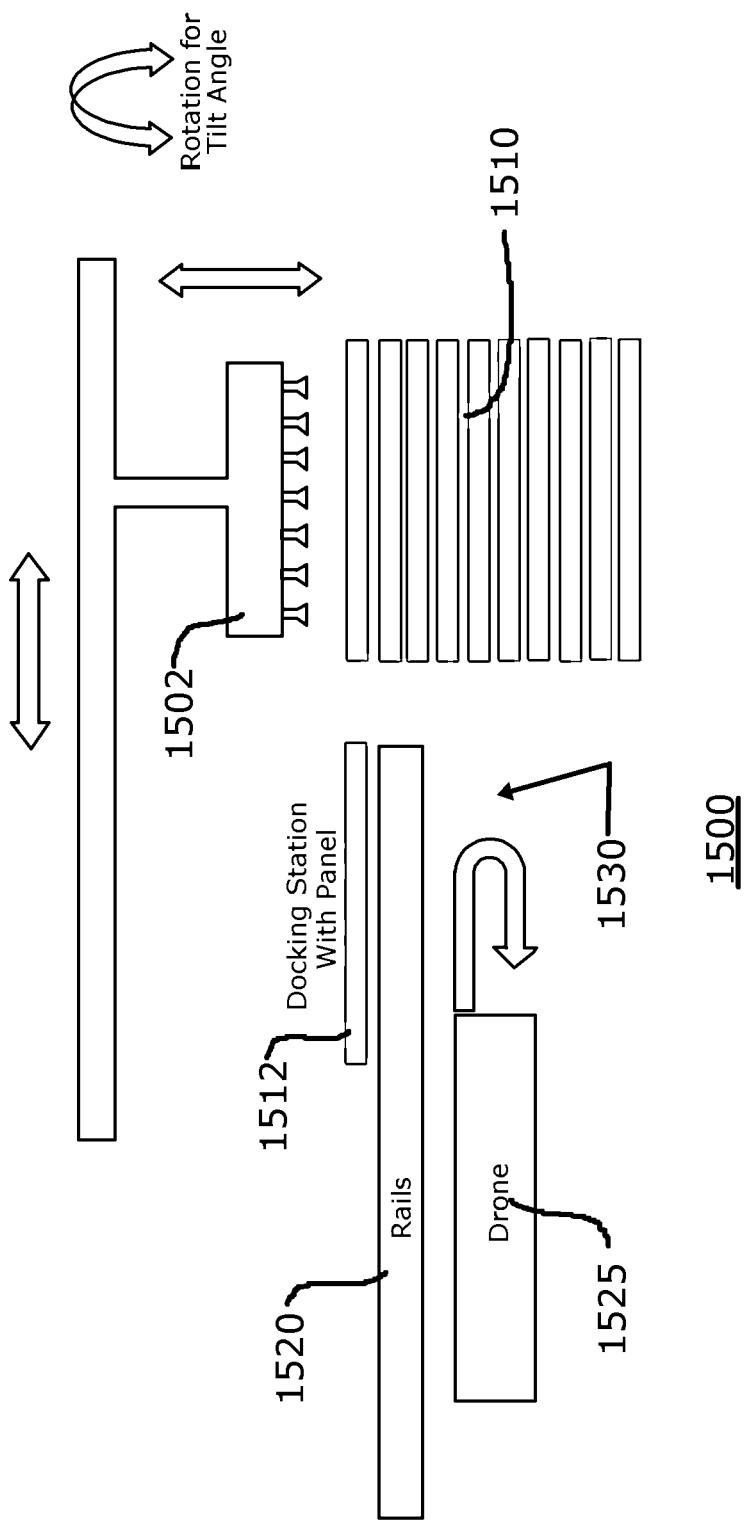
FIG. 15 is a simplified schematic representation of a vertical stack loader arrangement that feeds solar panels, in this specific illustrative embodiment of the invention, with the use of a gripper from above.

FIG. 15 is a simplified schematic representation of a vertical stack loader arrangement 1500 that feeds solar panels 1510, in this specific illustrative embodiment of the invention, with the use of a gripper 1502 from above. Gripper 1502 moves up and down to pick up a solar panel, and laterally to deposit solar panel 1512 onto rails 1520 of the rack arrangement (not shown in this figure). When it is desired to depopulate a solar panel array, gripper 1502 pick up solar panel 1512 at docking station region 1530 and deposits it onto the stack 1510.

This figure additionally shows that gripper 1592 will rotate so as to pick up or deposit the solar panels on or from a tilted stack of solar panels, as will be discussed in relation to FIG. 17, below.

Figure 16:
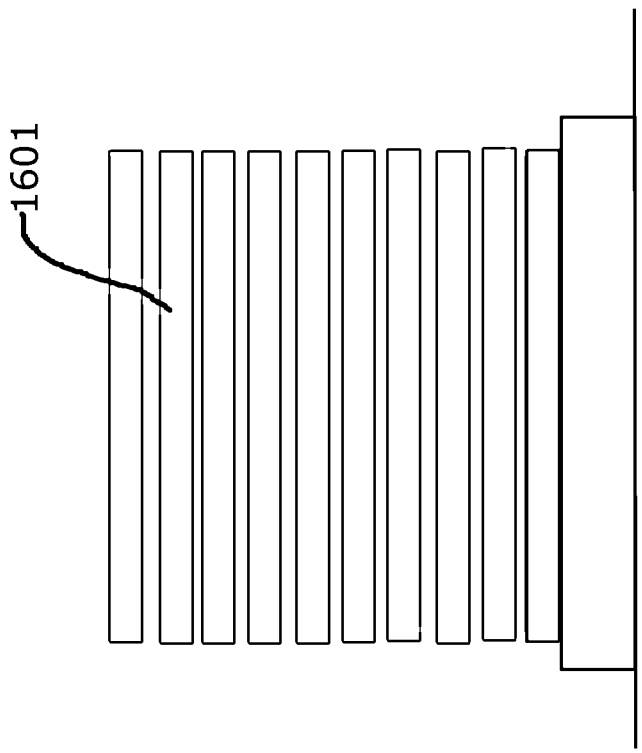
FIG. 16 is a simplified schematic representation of a specific illustrative embodiment of a vertical stack of solar panels.

FIG. 16 is a simplified schematic representation of a specific illustrative embodiment of a vertical stack of solar panels 1601.

Figure 17:
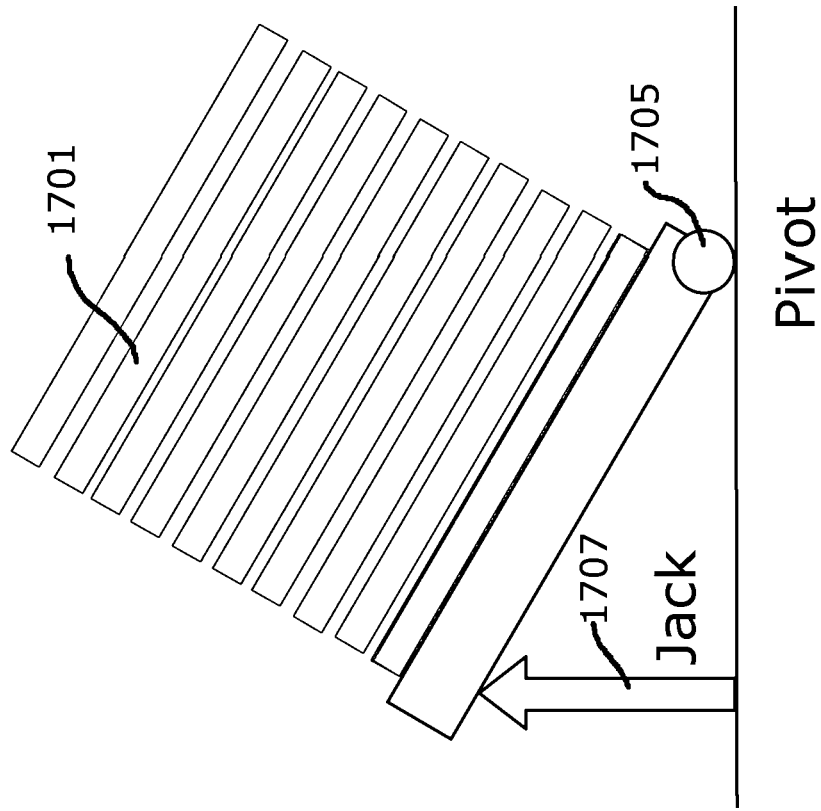
FIG. 17 is a simplified schematic representation of a specific illustrative embodiment of a stack of solar panels that has been tilted to facilitate the installation of the solar panels onto, or removal of the solar panels from, the rack arrangement.

FIG. 17 is a simplified schematic representation of a specific illustrative embodiment of a stack of solar panels 1701 that has been tilted to facilitate the installation of the solar panels onto, or removal of the solar panels from, the rack arrangement. The angle of the tilt of stack of solar panels 1701 corresponds in some embodiments to the angle of tilt of the solar panels in the solar panel array.

Figure 18:
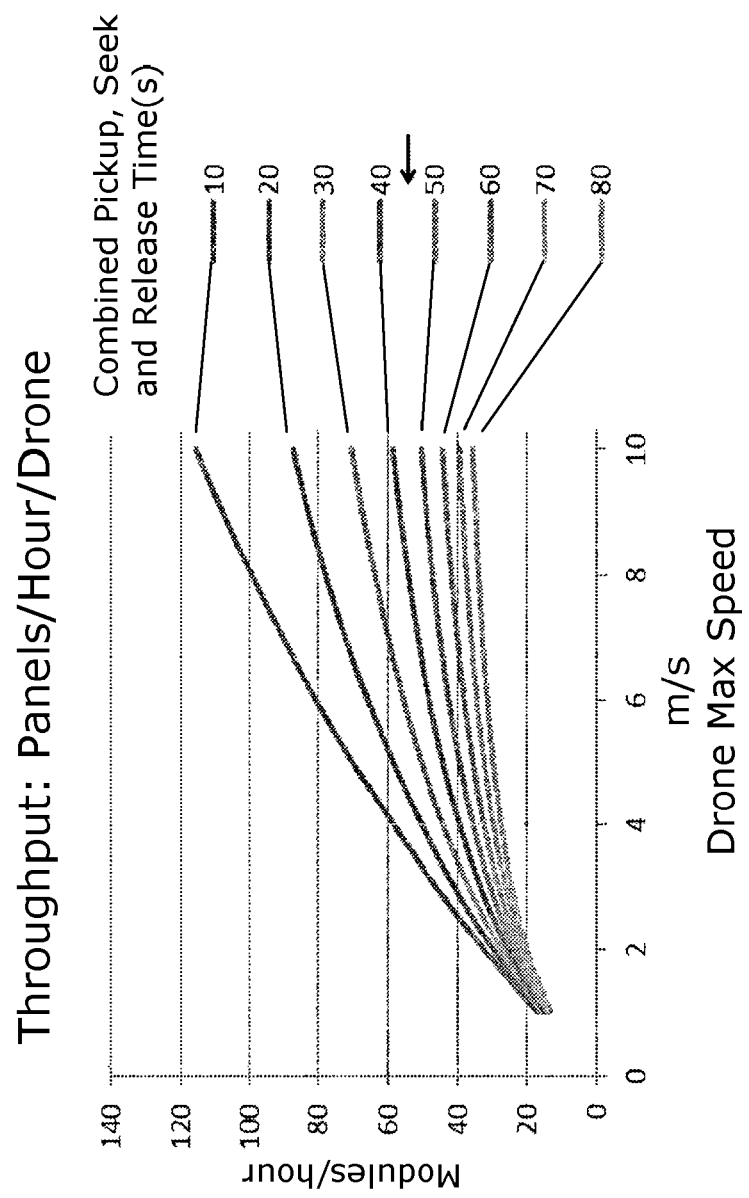
FIG. 18 is a graphical representation that illustrates an advantage that is obtained by the use of the present invention, the advantage being presented in terms of solar panels per hour per drone.

FIG. 18 is a graphical representation that illustrates an advantage that is obtained by the use of the present invention, the advantage being presented in terms of solar panels per hour per drone.

Figure 19:
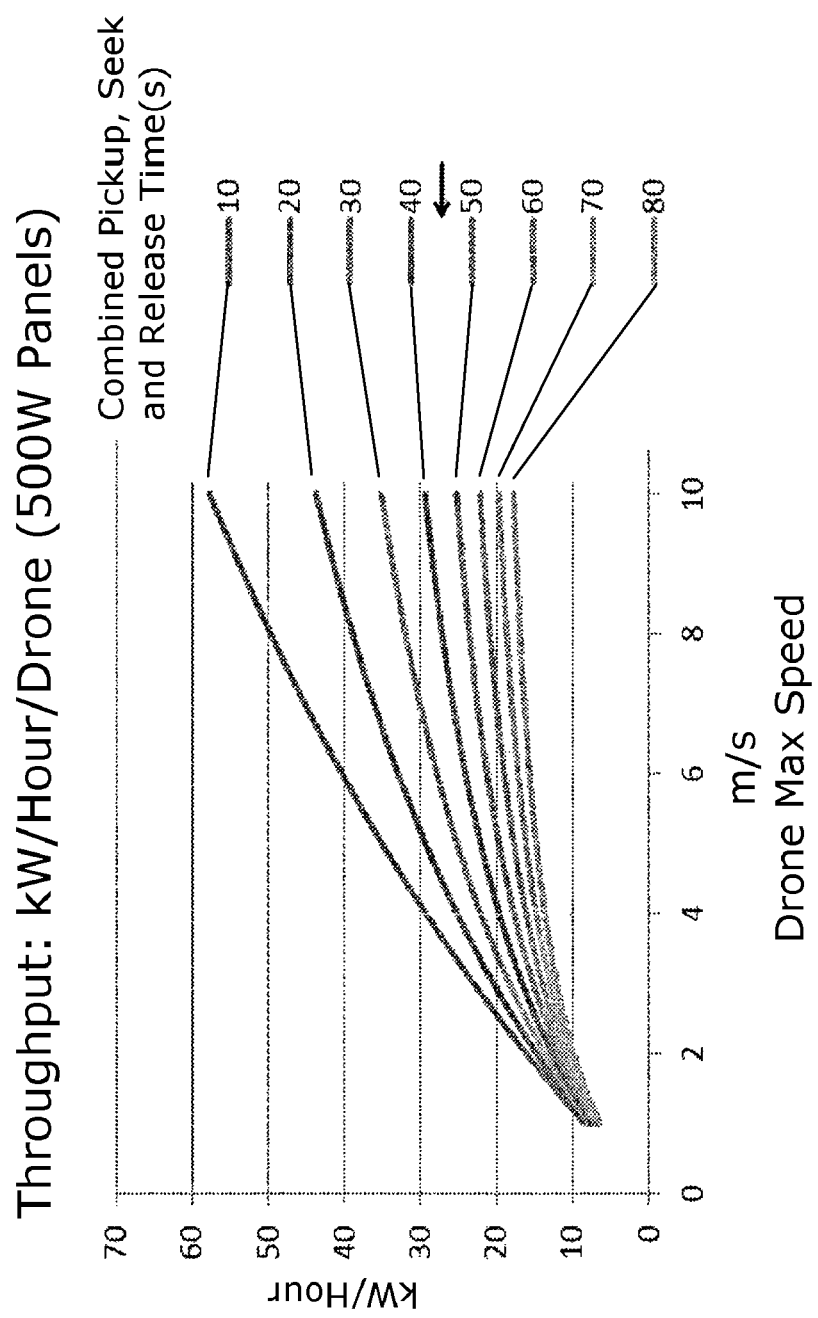
FIG. 19 is a graphical representation that illustrates an advantage that is obtained by the use of the present invention, the advantage being presented in terms of kilowatts per hour per drone, when used on solar panel modules that have 500 Watt electrical production capacity.

FIG. 19 is a graphical representation that illustrates an advantage that is obtained by the use of the present invention, the advantage being presented in terms of kilowatts per hour per drone, when used on solar panel modules that have 500 Watt electrical production capacity.

In the operation of an embodiment of the invention, certain use assumptions are made. These are:

Continuous array (rack) length: 99.125 m

Solar panel spacing: 1.625 m

Power per solar panel: 500 W (4 each at 125 W assembled)

Max drone speed: 4 m/s

The following is an analysis of the throughput advantage obtained from the use of the present invention on the installation of N solar panels of width w in an array that is L meters long in a time T. The number of runs corresponding to a trip from the repository of solar panels to the installation point and back that must be made by the drone to populate an array of length L with a panel width w is:

$$R = \frac{L}{w}$$

The total distance D traveled by the drone in the process of installing the entire array is:

$$D = \frac{L(L-w)}{w}$$

The total time for the installation T, assuming a panel locking time of $t_0$, which constitutes the time required to pick up and unload a solar panel, an acceleration/deceleration time i, and a travel velocity V, is:

$$T = Rt + Rt_0 + \frac{D}{V}$$

Solving for V, one obtains:

$$V = \frac{D}{T - Rt - R_{t_0}}$$

Finally, the acceleration/deceleration α is derived to be:

$$\alpha = \frac{V}{t}$$

In the practice of a practicable embodiment of the invention L=99.125 m; w=1.625 m; T=3600 s, and employing reasonable values of 30 seconds to load and unload a solar panel (i.e., t=15 s pickup and 15 s drop-off), and 3 s to achieve maximum velocity (t), one obtains:

R=61
V=3.75 m/s
D=5947.5 m
α=1.25 m/s$^2$

Figure 20:
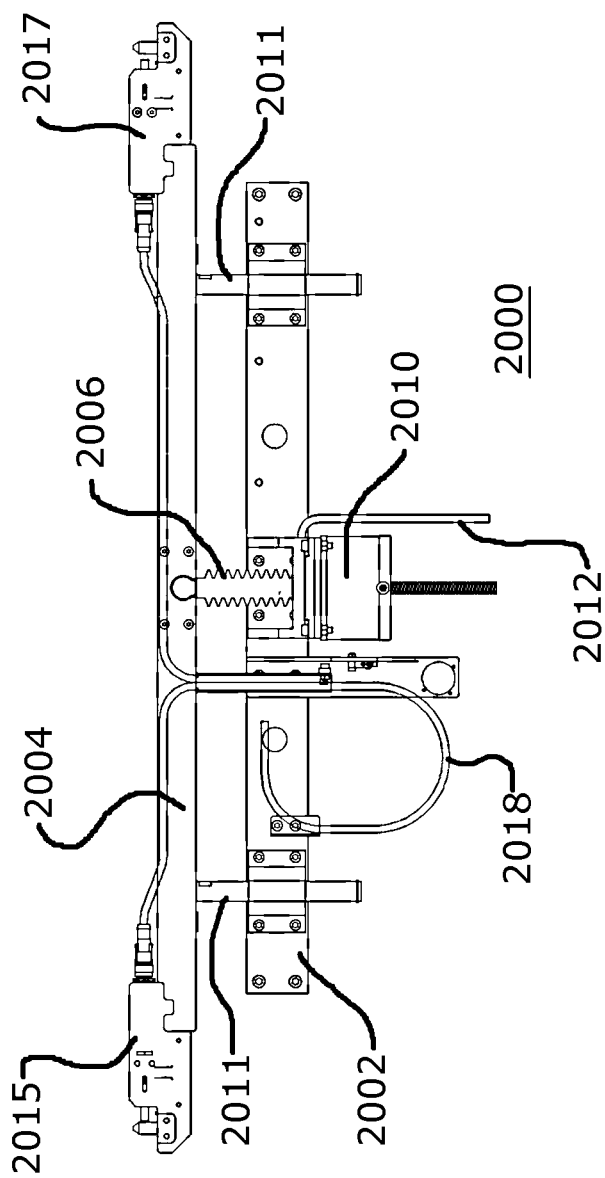
FIG. 20 is simplified schematic plan representation of a lift arrangement that is useful for inclusion as a carrier for installing solar panels.

FIG. 20 is simplified schematic plan representation of a lift arrangement 2000 that is useful for inclusion as a carrier for installing solar panels (not shown in this figure). Lift arrangement 2000 is shown to have a chassis 2002 that in this embodiment is fixedly supported by the drone (not shown in this figure). Lifting is performed by urging lifting element 2004 when it is desired to raise the solar panel (not shown in this figure). Lifting element 2004 is raised in response to urging by lift actuator 2006, which receives its actuation energy from a drive arrangement 2010. As lifting element is raised and lowered, it maintains a substantially parallel relation to the chassis by operation of guides 2011.

In this embodiment, rain that might enter drive arrangement 2010 is allowed to drain through drain pipe 2012.

There is additionally shown in this figure a pair of grippers 2015 and 2017 that function to lock, hold and release the solar panel in response to actuation.

FIGS. 21(a), 21(b), 21(c), and 21(d) show respective illustrative 180° arc, shallow arc, raised purlins, and triangular configurations that can be used in respective embodiments of top portions of the rack arrangement of the present invention. In light of the teaching herein, persons of skill in the art can configure the dimensions of these illustrative configurations to accommodate the passage of a drone therewithin, as well as accessories that would depend from the drone.

Although the invention has been described in terms of specific embodiments and applications, persons skilled in the art can, in light of this teaching, generate additional embodiments without exceeding the scope or departing from the spirit of the invention described and claimed herein. Accordingly, it is to be understood that the drawing and description in this disclosure are proffered to facilitate comprehension of the invention, and should not be construed to limit the scope thereof.

What is claimed is:

1. A solar panel array support system, the solar panel array being formed of a plurality of solar panels supported juxtaposed with one another along an array axis, the solar panel array support system comprising:
   a plurality of support elements, each having a support stanchion, the support stanchion having first and second support terminations, the distal ends of the first and second support terminations being disposed substantially orthogonal to the array axis, there being provided an unobstructed spatial region intermediate of the first and second support terminations, the unobstructed spatial region being configured to accommodate the passage of a vehicle therewithin;
   at least one solar panel supported on the supporting elements;
   a vehicle for transporting the solar panels disposed for travel through and within the unobstructed spatial region, said vehicle having first and second wheels arranged on opposing sides of said vehicle; and
   first and second track structures, each extending substantially parallel to the array axis and coupled to the distal end of a respective one of the first and second support terminations, said first and second track structures, each having a first elongated portion for engaging and supporting respectively associated ones of the first and second wheels, at least two of the plurality of support elements and said first and second track structures forming a rack arrangement for engaging and supporting the solar panel array.

2. The solar panel array support system of claim 1, wherein said vehicle is configured on a portion thereof distal from the portion of said vehicle that is disposed for travel within the unobstructed spatial region intermediate of the first and second support terminations of said support element, to engage a solar panel and to transport same along said first and second track structures.

3. The solar panel array support system of claim 2, wherein said first and second track structures each have a second elongated portion for engaging and supporting the solar panel array.

4. The solar panel array support system of claim 3, wherein there is further provided a latching arrangement on said vehicle for selectably grasping and releasing the solar panel.

5. The solar panel array support system of claim 4, wherein said latch arrangement comprises a solar panel lift arrangement.

6. The solar panel array support system of claim 4, wherein said vehicle is a motorized vehicle.

7. The solar panel array support system of claim 3, wherein at least one of said first and second track structures is provided with a third elongated portion for accommodating wiring of the solar panel array.

8. A solar panel array support system, the solar panel array being formed of a plurality of solar panels supported juxtaposed with one another along an array axis, the solar panel array support system comprising:
   a plurality of support elements, each having a support stanchion, the support stanchion having first and second support terminations, the distal ends of the first and second support terminations being disposed substantially orthogonal to the array axis, there being provided an unobstructed spatial region intermediate of the first and second support terminations, the unobstructed spatial region being configured to accommodate the passage of a vehicle therewithin;
   at least one solar panel supported on the supporting elements;
   first and second track structures, each extending substantially parallel to the array axis and coupled to the distal end of a respective one of the first and second support terminations, at least two of the plurality of support elements and said first and second track structures forming a rack arrangement for engaging and supporting the solar panel array; and
   a vehicle for transporting the solar panels, said vehicle being disposed for travel through and within the unobstructed spatial region, said vehicle having first and second wheels arranged on opposing sides of said vehicle for engaging the rack arrangement.

9. The solar panel array support system of claim 8, wherein said vehicle is provided with an anti-derailment wheel for preventing separation from the rack arrangement.

10. The solar panel array support system of claim 8, wherein there is further provided a latching arrangement on said vehicle for selectably grasping and releasing the solar panel.

11. The solar panel array support system of claim 8, wherein there is further provided a lifting arrangement on said vehicle for lifting the solar panel to where said latching arrangement can grasp the solar panel.

12. The solar panel array support system of claim 8, wherein said vehicle is a motorized vehicle.

13. The solar panel array support system of claim 8, wherein said vehicle is provided with a data input facility for receiving information about the solar panel array.

14. The solar panel array support system of claim 8, wherein said vehicle is provided with a sensor for producing a signal responsive to a potential collision.

15. The solar panel array support system of claim 8, wherein said vehicle is provided with a system for effecting an emergency stop response.

16. The solar panel array support system of claim 8, wherein said vehicle is provided with an arrangement for transporting an accessory, the accessory being transported through the unobstructed spatial region intermediate of the first and second support terminations.

\* \* \* \* \*